US009746979B2

(12) United States Patent
Yang

(10) Patent No.: US 9,746,979 B2
(45) Date of Patent: Aug. 29, 2017

(54) PIXEL CIRCUIT, DRIVING METHOD THEREOF AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventor: Shengji Yang, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/022,011

(22) PCT Filed: Sep. 18, 2014

(86) PCT No.: PCT/CN2014/086815
§ 371 (c)(1),
(2) Date: Mar. 15, 2016

(87) PCT Pub. No.: WO2015/192503
PCT Pub. Date: Dec. 23, 2015

(65) Prior Publication Data
US 2016/0224157 A1 Aug. 4, 2016

(30) Foreign Application Priority Data
Jun. 19, 2014 (CN) .......................... 2014 1 0276701

(51) Int. Cl.
*G06F 3/045* (2006.01)
*G06F 3/044* (2006.01)
(Continued)

(52) U.S. Cl.
CPC .............. *G06F 3/044* (2013.01); *G06F 3/042* (2013.01); *G06F 3/0412* (2013.01);
(Continued)

(58) Field of Classification Search
CPC ........ G06F 3/044; G06F 3/0412; G06F 3/042; G09G 3/3233; G09G 2310/0262; G09G 2360/14
(Continued)

(56) References Cited

U.S. PATENT DOCUMENTS

2007/0024547 A1    2/2007  Jang et al.
2010/0039406 A1*   2/2010  Lee ..................... G02F 1/13338
                                                       345/174
2014/0111473 A1*   4/2014  Yang ...................... G06F 3/044
                                                       345/174

FOREIGN PATENT DOCUMENTS

CN    101587400 A    11/2009
CN    102968220 A     3/2013
(Continued)

OTHER PUBLICATIONS

International Search Report dated Mar. 23, 2015 issued in corresponding International Application No. PCT/CN2014/086815 along with an English translation of the Written Opinion of the International Searching Authority.
(Continued)

*Primary Examiner* — Mark Regn
(74) *Attorney, Agent, or Firm* — Nath, Goldberg & Meyer; Joshua B. Goldberg

(57) ABSTRACT

The present invention provides a pixel circuit comprising a plurality of pixel structures, each pixel structure comprising a drive unit, a compensation unit and a light-emitting unit, wherein in the adjacent first pixel structure and second pixel structure, the first pixel structure further comprises a capaci-
(Continued)

tive touch unit, and the second pixel structure further comprises a photosensitive touch unit; the compensation unit in the first pixel structure, the compensation unit in the second pixel structure, the capacitive touch unit and the photosensitive touch unit share a data line, and the capacitive touch unit and the photosensitive touch unit share a read line.

20 Claims, 9 Drawing Sheets

(51) Int. Cl.
G06F 3/042 (2006.01)
G06F 3/041 (2006.01)
G09G 3/3233 (2016.01)

(52) U.S. Cl.
CPC ......... *G06F 3/0416* (2013.01); *G09G 3/3233* (2013.01); *G09G 2310/0262* (2013.01); *G09G 2360/14* (2013.01)

(58) Field of Classification Search
USPC .......................................................... 345/174
See application file for complete search history.

(56) References Cited

FOREIGN PATENT DOCUMENTS

| CN | 103295525 | * | 9/2013 |
| CN | 103295525 A | | 9/2013 |
| CN | 103310734 A | | 9/2013 |
| KR | 1020090121635 A | | 11/2009 |
| KR | 1020110023867 A | | 3/2011 |

OTHER PUBLICATIONS

Notification of Reason for Refusal dated Jun. 15, 2017 corresponding to Korean application No. 10-2016-7033963.

* cited by examiner

PIXEL CIRCUIT, DRIVING METHOD THEREOF AND DISPLAY DEVICE

This is a National Phase Application filed under 35 U.S.C. 371 as a national stage of PCT/CN2014/086815, filed Sep. 18, 2014, an application claiming the benefit of Chinese Application No. 201410276701.8, filed Jun. 19, 2014, the content of each of which is hereby incorporated by reference in its entirety.

FIELD OF THE INVENTION

The present invention relates to the field of display technology, and particularly relates to a pixel circuit, a driving method thereof, and a display device including the pixel circuit.

BACKGROUND OF THE INVENTION

An organic light-emitting diode (OLED) display is one of the hot topics in the research field of flat-panel displays at present. Compared with a liquid crystal display (LCD), the OLED display has the advantages of low energy consumption, low production cost, self-luminescence, wide view angle, fast response and so on. At present, the OLED display has begun to gradually replace the traditional LCD in the display fields, such as mobile phones, PDAs, digital cameras.

In the OLED display technology, the design of a pixel drive circuit is the core technique. The LCD is voltage driven, i.e., controlling transmittance and brightness of liquid crystal by using a stable voltage; and differing from the LCD, the OLED display is current driven, controlling an OLED device to emit light by using a stable current. In the traditional OLED displays, generally, the light emission of the OLED device is controlled by employing a 2T1C pixel circuit. As shown in FIG. 1, the 2T1C pixel circuit is composed of a driving thin film transistor (TFT) T2, a switching thin film transistor T1 and a storage capacitor (Cs for short), the T1 is connected to a scan line, and also connected to a data line; when the scan line selects a row, a voltage Vscan of the scan line is at a low level, the T1 is turned on, and a voltage Vdata of the data line is written into the Cs through the T1; when the scan in this row is finished, the Vscan is changed to a high level, the T1 is cut off, and the voltage stored on the Cs drives the T2 to generate a current for driving the OLED, thereby ensuring that the OLED continuously emits light in one frame time; a saturation current, i.e., the current flowing through the OLED, of the T2 is $I_{OLED}=K(V_{GS}-V_{th})^2$, where $V_{GS}$ is a gate-source voltage of the T2, and $V_{th}$ is a threshold voltage of the T2. It can be seen that $I_{OLED}$ is related to the threshold voltage $V_{th}$ of the T2. Moreover, due to the reasons of manufacturing process and aging of devices, the threshold voltages $V_{th}$ of the driving TFTs in respective pixels may drift, i.e., the threshold voltages of the driving TFTs in respective pixels are inconsistent, easily resulting in different currents for the OLED flowing through the respective pixels due to the different threshold voltages of the driving TFTs thereof, so that a display brightness of a display screen is non-uniform, thereby affecting a display effect of the whole image.

In order to further eliminate the impact of the threshold voltage of the driving TFT on the drive current, a pixel circuit including more TFTs and Css has emerged, which includes a compensation circuit configured to compensate the threshold voltage of the driving TFT. However, in the prior art, one pixel circuit is only limited in one sub-pixel unit. FIG. 2 shows an arrangement mode of the sub-pixel units in the prior art, each sub-pixel unit has one pixel circuit, and each pixel circuit includes an exclusive compensation circuit, so that the sub-pixel units are all connected to the data lines. In the case of meeting the driving requirements, considering many factors such as distribution space of the TFT, the Cs and the data line, the pixel circuit in the prior art makes it difficult to achieve a finer pixel resolution by compressing the pixel pitches.

Meanwhile, in the touch field at present, two modes, which are capacitive touch and photosensitive touch, are the most easily accepted and recognized by consumers, if the above two touch technologies can be integrated to the OLED display to achieve integration of the manufacture procedure of the touch and that of the OLED display together, the integration representing a high added value and the latest technical functions are hound to occupy an impregnable position in the field of display technology in the future. However, the addition of the above two touch functions is bound to further increase the pixel pitch, which makes it more difficult to achieve a fine pixel resolution.

SUMMARY OF THE INVENTION

To overcome the shortcomings in the prior art, the technical problem to be solved by the present invention is to provide a pixel circuit, a driving method thereof, and a display device including the pixel circuit, which can reduce the number of transistors in a compensation circuit in the pixel circuit and the number of its required data lines in the prior art, thereby substantially compressing pixel pitches and reducing the cost of IC, and then enabling a current flowing through OLED in each pixel not to be affected by a threshold voltage $V_{th}$ of a driving transistor thereof, and finally ensuring uniformity of image display.

A technical solution adopted to solve the technical problem to be solved by the present invention is a pixel circuit, including a plurality of pixel structures, each pixel structure including a drive unit, a compensation unit and a light-emitting unit, wherein in the adjacent first pixel structure and second pixel structure, the first pixel structure further includes a capacitive touch unit, and the second pixel structure further includes a photosensitive touch unit; and the compensation unit in the first pixel structure, the compensation unit in the second pixel structure, the capacitive touch unit and the photosensitive touch unit share a data line, and the capacitive touch unit and the photosensitive touch unit share a read line, wherein:

the compensation unit is configured to adjust a drive voltage of a driving transistor in the drive unit, so as to eliminate the impact of a threshold voltage of the driving transistor on a current flowing through the light-emitting unit, and the data line is configured to provide a data signal to the driving transistor;

the capacitive touch unit is configured to generate a corresponding electrical signal according to a capacitive touch signal, the data line is configured to provide an initial signal to the capacitive touch unit, and the read line is configured to read the capacitive touch signal; and the photosensitive touch unit is configured to generate a corresponding electrical signal according to a photosensitive touch signal, the data line is configured to provide an initial signal to the photosensitive touch unit, and the read line is configured to read the photosensitive touch signal.

For example, the capacitive touch signal is a finger touch signal, and the photosensitive touch signal is a laser pointer touch signal.

Preferably, the compensation unit in the first pixel structure and the compensation unit in the second pixel structure are of the same structure and arranged symmetrically, the data line is arranged between the compensation unit in the first pixel structure and the compensation unit in the second pixel structure, and connected to the compensation unit in the first pixel structure and the compensation unit in the second pixel structure respectively.

Preferably, the drive unit in the first pixel structure includes a first driving transistor, and the drive unit in the second pixel structure includes a second driving transistor; the first driving transistor and the second driving transistor are of the same structure and arranged symmetrically; the data line is arranged between the first driving transistor and the second driving transistor, and connected to the first driving transistor and the second driving transistor respectively.

Preferably, the compensation unit in the first pixel structure includes a first transistor, a third transistor, a fifth transistor, a seventh transistor, a ninth transistor and a first capacitor, and the compensation unit in the second pixel structure includes a second transistor, a fourth transistor, a sixth transistor, an eighth transistor, a tenth transistor and a second capacitor; the pixel circuit further includes a first scan line, a second scan line, a third scan line and a light emission control signal line, wherein:

a gate electrode of the first transistor is connected to a gate electrode of the second transistor, and also connected to the light emission control signal line, a first electrode of the first transistor is respectively connected to a first electrode of the second transistor and a high voltage terminal, and a second electrode of the first transistor is connected to a first electrode of the first driving transistor;

a gate electrode of the third transistor is connected to the second scan line, a first electrode of the third transistor is respectively connected to one terminal of the first capacitor and a gate electrode of the first driving transistor, and a second electrode of the third transistor is connected to the first electrode of the first driving transistor;

a gate electrode of the fifth transistor is connected to the first scan line, a first electrode of the fifth transistor is connected to a low potential terminal, and a second electrode of the fifth transistor is connected to the gate electrode of the first driving transistor;

a gate electrode of the seventh transistor is connected to the second scan line, a first electrode of the seventh transistor is connected to the data line, and a second electrode of the seventh transistor is respectively connected to a second electrode of the first driving transistor and a first electrode of the ninth transistor;

a gate electrode of the ninth transistor is connected to a gate electrode of the tenth transistor, and also connected to the light emission control signal line, the first electrode of the ninth transistor is connected to the second electrode of the first driving transistor, and a second electrode of the ninth transistor is connected to the light-emitting unit in the first pixel structure;

one terminal of the first capacitor is connected to the first electrode of the first transistor, and the other terminal thereof is connected to the first electrode of the third transistor;

a second electrode of the second transistor is connected to the first electrode of the second driving transistor;

a gate electrode of the fourth transistor is connected to the third scan line, a first electrode of the fourth transistor is respectively connected to one terminal of the second capacitor and a gate electrode of the second driving transistor, and a second electrode of the fourth transistor is connected to a first electrode of the second driving transistor;

a gate electrode of the sixth transistor is connected to the first scan line, a first electrode of the sixth transistor is connected to the low potential terminal, and a second electrode of the sixth transistor is connected to the gate electrode of the second driving transistor;

a gate electrode of the eighth transistor is connected to the third scan line, a first electrode of the eighth transistor is connected to the data line, and a second electrode of the eighth transistor is respectively connected to the second electrode of the second driving transistor and a first electrode of the tenth transistor;

the first electrode of the tenth transistor is connected to the second electrode of the second driving transistor, and a second electrode of the tenth transistor is connected to the light-emitting unit in the second pixel structure; and one terminal of the second capacitor is connected to the first electrode of the second transistor, and the other terminal thereof is connected to the first electrode of the fourth transistor.

Preferably, the capacitive touch unit includes a first capacitive transistor, a second capacitive transistor, a third capacitive transistor and a third capacitor, wherein:

a gate electrode of the first capacitive transistor is connected to the first scan line, a first electrode of the first capacitive transistor is connected to the data line, and a second electrode of the first capacitive transistor is respectively connected to a gate electrode of the second capacitive transistor and one terminal of the third capacitor;

a first electrode of the second capacitive transistor is respectively connected to the other terminal of the third capacitor and a reference potential terminal, and a second electrode of the second capacitive transistor is connected to a second electrode of the third capacitive transistor; and a gate electrode of the third capacitive transistor is connected to the photosensitive touch unit, and a first electrode of the third capacitive transistor is connected to the read line.

Preferably, the photosensitive touch unit includes a first photo sensor, a second photo sensor, a third photo sensor, a fourth photo sensor and a fourth capacitor, wherein:

a gate electrode of the first photo sensor is connected to the first scan line, a first electrode of the first photo sensor is connected to the low potential terminal, and a second electrode of the first photo sensor is respectively connected to a second electrode of the second photo sensor, a gate electrode and a first electrode of the fourth photo sensor;

a gate electrode of the second photo sensor is connected to the gate electrode of the third capacitive transistor in the capacitive touch unit, a first electrode of the second photo sensor is connected to the data line, and the second electrode of the second photo sensor is connected to the first electrode of the fourth photo sensor;

a gate electrode of the third photo sensor is connected to the third scan line, a first electrode of the third photo sensor is connected to a second electrode of the fourth photo sensor, and a second electrode of the third photo sensor is connected to the read line; and one terminal of the fourth capacitor is connected to the gate electrode of the fourth photo sensor, and the other terminal thereof is connected to the second electrode of the fourth photo sensor.

Preferably, the light-emitting unit in the first pixel structure includes a first organic light-emitting diode of which an anode is connected to the second electrode of the ninth transistor and a cathode is connected to the low potential terminal; and the light-emitting unit in the second pixel structure includes a second organic light-emitting diode of which an anode is connected to the second electrode of the tenth transistor and a cathode is connected to the low potential terminal.

Preferably, the first transistor to the tenth transistor, the first photo sensor to the fourth photo sensor, the first capacitive transistor to the third capacitive transistor, the first driving transistor and the second driving transistor are all P type thin film transistors, wherein the first electrodes are source electrodes, and the second electrodes are drain electrodes.

A display device includes the aforementioned pixel circuit.

Preferably, the adjacent first pixel structure and second pixel structure are adjacent sub-pixel units in the same pixel unit.

In a driving method of a pixel circuit, the pixel circuit including a plurality of pixel structures, and each pixel structure including a drive unit, a compensation unit and a light-emitting unit, wherein in the adjacent first pixel structure and second pixel structure, the first pixel structure further includes a capacitive touch unit, and the second pixel structure further includes a photosensitive touch unit; the driving method includes: time division multiplexing the data line by the compensation unit in the first pixel structure, the compensation unit in the second pixel structure, the capacitive touch unit and the photosensitive touch unit, and time division multiplexing the read line by the capacitive touch unit and the photosensitive touch unit.

Preferably, in one frame time, the driving method includes the following phases:

a reset phase: providing a reset signal by the data line, resetting the drive unit by the compensation unit, and resetting the capacitive touch unit and the photosensitive touch unit at the same time;

a first drive phase: providing a first drive signal by the data line, discharging by the compensation unit in the first pixel structure; amplifying and acquiring the capacitive touch signal by the capacitive touch unit, and transmitting the capacitive touch signal to a touch execution unit through the read line; and implanting the initial signal in the photosensitive touch unit;

a second drive phase: providing a second drive signal by the data line, discharging by the compensation unit in the second pixel structure; stagnating the touch of the capacitive touch unit; amplifying and acquiring the photosensitive touch signal by the photosensitive touch unit, and transmitting the photosensitive touch signal to the touch execution unit through the read line; and a light emission phase: providing a light-emitting signal by the light-emitting control signal line, stagnating the touch of the capacitive touch unit and the photosensitive touch unit; driving the light-emitting unit to emit light by the drive units in the first pixel structure and the second pixel structure respectively.

The beneficial effects of the present invention are as follow: the pixel circuit improves flexibility of the touch by integrating a capacitive touch function and a photosensitive touch function into a whole; the pixel circuit further combines the compensation units in the adjacent sub-pixel units into a whole, such that the adjacent sub-pixel units can share one data line (i.e., one data line controls the compensation units in the two sub-pixel units), thereby sharing the compensation unit to drive the two sub-pixel units. Hence, the number of the transistors in the compensation circuit and the number of the data lines may be reduced, the pixel pitch may be substantially compressed and the cost of IC is reduced, thereby obtaining higher image quality and higher PPI (Pixels Per Inch). Meanwhile, it solves the problem that inconsistent currents flowing through the OLED in the pixels caused by inconsistent threshold voltages ($V_{th}$) of the driving transistors in pixels due to manufacturing process and long time operation, thereby enabling the current flowing through the OLED in each pixel not to be affected by the threshold voltage $V_{th}$ of the driving transistor, and finally ensuring uniformity of the image display. Moreover, the compensation unit ensures that there is no current flowing through the OLED in the reset phase and the drive phase of the pixel circuit, which indirectly prolongs the service life of the OLED.

BRIEF DESCRIPTION OF THE DRAWINGS

FIG. 5A is a schematic diagram of the pixel circuit in a reset phase;

FIG. 5B is a schematic diagram of the pixel circuit in a first drive phase;

FIG. 5C is a schematic diagram illustrating a potential of one terminal of a capacitor is lowered by a capacitive touch on a capacitive touch unit in the first drive phase;

FIG. 5D is a schematic diagram of the pixel circuit in a second drive phase;

FIG. 5E is a schematic diagram of the pixel circuit in a light emission phase.

REFERENCE NUMERALS

1: drive unit; 2: compensation unit; 3: light-emitting unit; 4: capacitive touch unit; and 5: photosensitive touch unit.

DETAILED DESCRIPTION OF THE EMBODIMENTS

To make those skilled in the art better understand the technical solutions of the present invention, the pixel circuit, driving method thereof and the display device of the present invention will be further described below in details below with reference to the accompanying drawings and specific implementations.

First Embodiment

This embodiment provides a pixel circuit and a driving method corresponding to the pixel circuit.

Figure 1:
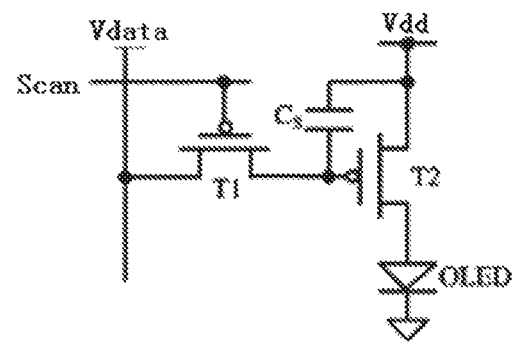
FIG. 1 is a schematic diagram of a 2T1C pixel circuit in the prior art.
Figure 2:
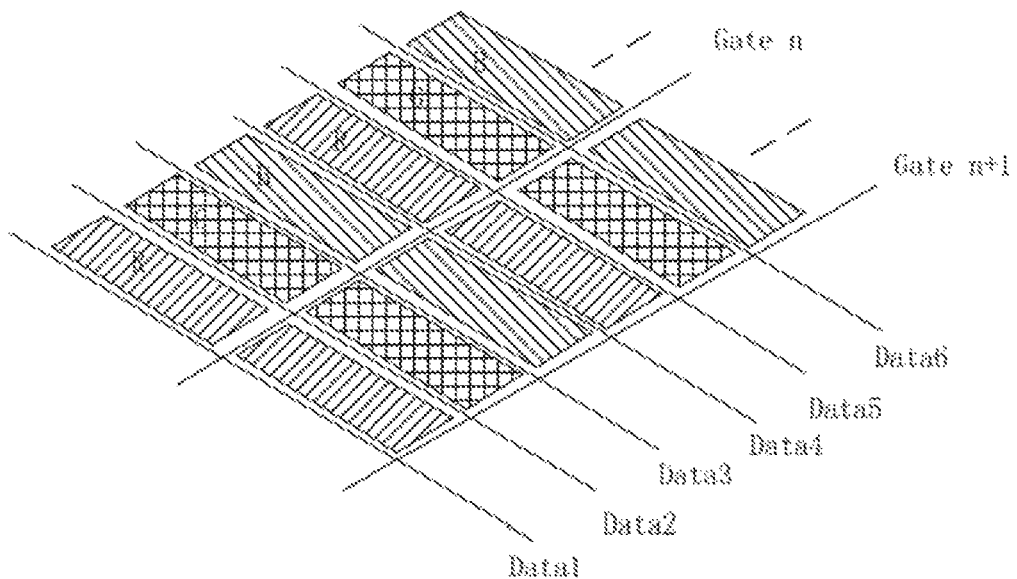
FIG. 2 is a schematic diagram of an arrangement mode of sub-pixel units in the prior art.
Figure 3:
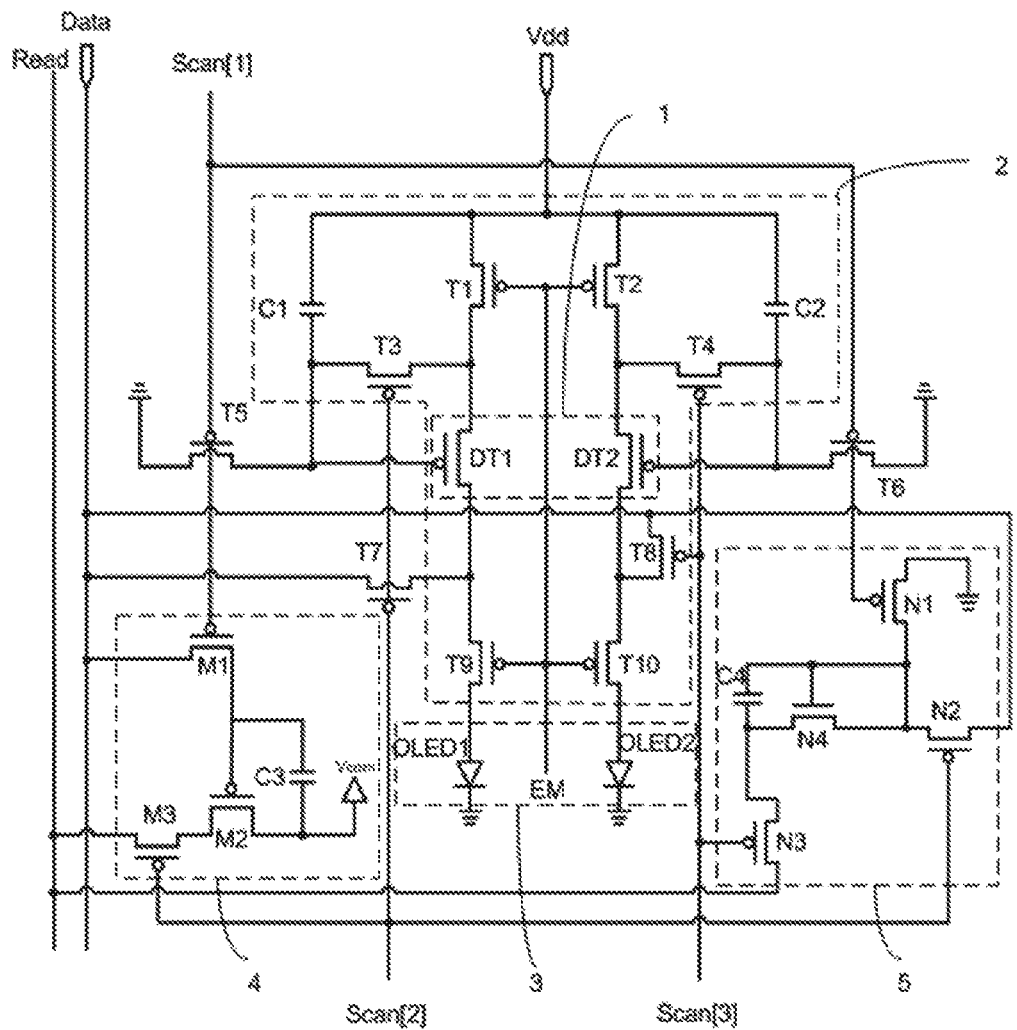
FIG. 3 is a schematic diagram of a pixel circuit in a first embodiment of the present invention.

As shown in FIG. 3, the pixel circuit includes a plurality of pixel structures, and each pixel structure is used for one sub-pixel unit. Specifically, the pixel circuit includes a drive unit 1, a compensation unit 2 and a light-emitting unit 3, wherein in the adjacent first pixel structure and second pixel structure, the drive unit 1 is composed of a drive unit in the first pixel structure and a drive unit in the second pixel structure, the compensation unit 2 is composed of a compensation unit in the first pixel structure and a compensation unit in the second pixel structure, and the light-emitting unit 3 is composed of a light-emitting unit in the first pixel structure and a light-emitting unit in the second pixel structure; the first pixel structure also includes a capacitive touch unit 4, and the second pixel structure also includes a photosensitive touch unit 5; and the compensation unit in the first pixel structure, the compensation unit in the second pixel structure, the capacitive touch unit 4 and the photosensitive touch unit 5 share a data line, and the capacitive touch unit 4 and the photosensitive touch unit 5 share a read line.

The compensation unit 2 is configured to adjust a drive voltage of a driving transistor in the drive unit 1, so as to eliminate the impact of a threshold voltage of the driving transistor on a current flowing through the light-emitting unit 3, and the data line is configured to provide a data signal to the driving transistor.

The capacitive touch unit 4 is configured to generate a corresponding electrical signal according to a capacitive touch signal, e.g., to generate a corresponding electrical signal according to a finger touch signal; the data line is configured to provide an initial signal to the capacitive touch unit 4, and the read line is configured to read the capacitive touch signal (e.g., the finger touch signal).

The photosensitive touch unit 5 is configured to generate a corresponding electrical signal according to a photosensitive touch signal, e.g., to generate a corresponding electrical signal according to a laser pointer touch signal; the data line is configured to provide an initial signal to the photosensitive touch unit 5, and the read line is configured to read the photosensitive touch signal (e.g., the laser pointer touch signal).

Preferably, the compensation unit in the first pixel structure and the compensation unit in the second pixel structure are of the same structure and arranged symmetrically, the data line (shown at one side in FIG. 3 for clarity of the drawing) is arranged between the compensation unit in the first pixel structure and the compensation unit in the second pixel structure, and connected to the compensation unit in the first pixel structure and the compensation unit in the second pixel structure respectively.

Specifically, as shown in FIG. 3, the drive unit in the first pixel structure includes a first driving transistor DT1, and the drive unit in the second pixel structure includes a second driving transistor DT2, i.e., the DT1 and the DT2 are respectively driving transistors of the two sub-pixel units. The first driving transistor DT1 and the second driving transistor DT2 are of the same structure and arranged symmetrically; the data line is arranged between the first driving transistor DT1 and the second driving transistor DT2, and connected to the first driving transistor DT1 and the second driving transistor DT2 respectively.

The compensation unit in the first pixel structure includes a first transistor T1, a third transistor T3, a fifth transistor T5, a seventh transistor T7, a ninth transistor T9 and a first capacitor C1, the compensation unit in the second pixel structure includes a second transistor T2, a fourth transistor T4, a sixth transistor T6, an eighth transistor T8, a tenth transistor T10 and a second capacitor C2; the pixel circuit further includes a first scan line Scan[1], a second scan line Scan[2], a third scan line Scan[3] and a light emission control signal line EM. In this embodiment, the T1 to the T10 are switching transistors; the Scan[1], the Scan[2] and the Scan[3] all input scan signals; EM inputs a light-emitting control signal to control the light-emitting unit 3 to emit light; and the first capacitor C1 and the second capacitor C2 are storage capacitors.

Specifically, a gate electrode of the first transistor T1 is connected to a gate electrode of the second transistor T2, and also connected to the light emission control signal line EM, a first electrode of the first transistor T1 is respectively connected to a first electrode of the second transistor T2 and a high potential terminal Vdd, and a second electrode of the first transistor T1 is connected to a first electrode of the first driving transistor DT1.

A gate electrode of the third transistor T3 is connected to the second scan line Scan[2], a first electrode of the third transistor T3 is respectively connected to one terminal of the first capacitor C1 and a gate electrode of the first driving transistor DT1, and a second electrode of the third transistor T3 is connected to the first electrode of the first driving transistor DT1.

A gate electrode of the fifth transistor T5 is connected to the first scan line Scan[1], a first electrode of the fifth transistor T5 is connected to a low potential terminal, and a second electrode of the fifth transistor T5 is connected to the gate electrode of the first driving transistor DT1.

A gate electrode of the seventh transistor T7 is connected to the second scan line Scan[2], a first electrode of the seventh transistor T7 is connected to the data line, and a second electrode of the seventh transistor T7 is respectively connected to a second electrode of the first driving transistor DT1 and a first electrode of the ninth transistor T9.

A gate electrode of the ninth transistor T9 is connected to a gate electrode of the tenth transistor T10, and also connected to the light emission control signal line EM, the first electrode of the ninth transistor T9 is connected to the second electrode of the first driving transistor DT1, and a second electrode of the ninth transistor T9 is connected to the light-emitting unit in the first pixel structure.

One terminal of the first capacitor C1 is connected to the first electrode of the first transistor T1, and the other terminal thereof is connected to the first electrode of the third transistor T3.

A second electrode of the second transistor 12 is connected to the first electrode of the second driving transistor DT2.

A gate electrode of the fourth transistor T4 is connected to the third scan line Scan [3], a first electrode of the fourth transistor T4 is respectively connected to one terminal of the second capacitor C2 and a gate electrode of the second driving transistor DT2, and a second electrode of the fourth transistor T4 is connected to a first electrode of the second driving transistor D12.

A gate electrode of the sixth transistor T6 is connected to the first scan line Scan[1], a first electrode of the sixth transistor T6 is connected to the low potential terminal, and a second electrode of the sixth transistor T6 is connected to the gate electrode of the second driving transistor DT2.

A gate electrode of the eighth transistor T8 is connected to the third scan line Scan [3], a first electrode of the eighth transistor T8 is connected to the data line, and a second electrode of the eighth transistor T8 is respectively connected to the second electrode of the second driving transistor DT2 and a first electrode of the tenth transistor T10.

The first electrode of the tenth transistor 110 is connected to the second electrode of the second driving transistor DT2, and a second electrode of the tenth transistor T10 is connected to the light-emitting unit in the second pixel structure.

One terminal of the second capacitor C2 is connected to the first electrode of the second transistor T2, and the other terminal thereof is connected to the first electrode of the fourth transistor T4.

The capacitive touch unit 4 includes a first capacitive transistor M1, a second capacitive transistor M2, a third capacitive transistor M3 and a third capacitor C3; the M1 is a signal pre-charge transistor; the M2 is a signal amplifier transistor playing a role of amplifying a current signal; the M3 is a switching transistor.

Specifically, a gate electrode of the first capacitive transistor M1 is connected to the first scan line Scan [1], a first electrode of the first capacitive transistor M1 is connected to the data line, and a second electrode of the first capacitive transistor M1 is respectively connected to a gate electrode of the second capacitive transistor M2 and one terminal of the third capacitor C3.

A first electrode of the second capacitive transistor M2 is connected to a second electrode of the third capacitive transistor M3, and a second electrode of the second capacitive transistor M2 is respectively connected to the other terminal of the third capacitor C3 and a reference potential terminal (for coupling reset of the capacitor).

A gate electrode of the third capacitive transistor M3 is connected to the photosensitive touch unit 5, and a first electrode of the third capacitive transistor M3 is connected to the read line.

The photosensitive touch unit 5 includes a first photo sensor N1, a second photo sensor N2, a third photo sensor N3, a fourth photo sensor N4 and a fourth capacitor C4; the N4 is a photo sensor, i.e., when the light is irradiated on the photo sensor, a photocurrent will be generated, and the photocurrents with different intensities will be generated based on different light intensities. The N1, the N2 and the N3 are switching transistors playing a role of switching control, and the N2 also plays a role of reading light sensitive data at the same time; the C4 is a storage capacitor configured to store the photocurrents generated by the photo sensors.

Specifically, a gate electrode of the first photo sensor N1 is connected to the first scan line Scan [1], a first electrode of the first photo sensor N1 is connected to the low potential terminal, and a second electrode of the first photo sensor N1 is respectively connected to a second electrode of the second photo sensor N2, a gate electrode and a first electrode of the fourth photo sensor N4.

A gate electrode of the second photo sensor N2 is connected to the gate electrode of the third capacitive transistor M3 in the capacitive touch unit 4, a first electrode of the second photo sensor N2 is connected to the data line, and the second electrode of the second photo sensor N2 is connected to the first electrode of the fourth photo sensor N4.

A gate electrode of the third photo sensor N3 is connected to the third scan line Scan [3], a first electrode of the third photo sensor N3 is connected to a second electrode of the fourth photo sensor N4, and a second electrode of the third photo sensor N3 is connected to the read line.

One terminal of the fourth capacitor C4 is connected to the gate electrode of the fourth photo sensor N4, and the other terminal thereof is connected to the second electrode of the fourth photo sensor N4.

The light-emitting unit in the first pixel structure includes a first organic light-emitting diode OLED1 of which an anode is connected to the second electrode of the ninth transistor T9 and a cathode is connected to the low potential terminal.

The light-emitting unit in the second pixel structure includes a second organic light-emitting diode OLED2 of which an anode is connected to the second electrode of the tenth transistor T10 and a cathode is connected to the low potential terminal.

In this embodiment, the transistors in the pixel circuit are all described by using a thin film transistor (TFT) as an example. In this embodiment, the first transistor T1 to the tenth transistor T10, the first photo sensor N1 to the fourth photo sensor N4, the first capacitive transistor M1 to the third capacitive transistor M3, the first driving transistor DT1 and the second driving transistor DT2 are all P type thin film transistors, wherein the first electrodes are source electrodes, and the second electrodes are drain electrodes. Or, the T1 to the T10, the N1 to the N4 and the M1 to the M3 in the pixel circuit are all N type thin film transistors, wherein the first electrodes are drain electrodes, and the second electrodes are source electrodes. Or, the T1 to the T10, the N1 to the N4 and the M1 to the M3 in the pixel circuit adopt the N type thin film transistor and the P type thin film transistor in a hybrid mode, as long as the terminals of the thin film transistors of selected type are correspondingly connected. Meanwhile, it should be understood that, in this embodiment, the T1 to the T10, the N1 to the N4 and the M1 to the M3 are also not limited to thin film transistors, any controller with a voltage control capability to enable the present invention to work according to the required working mode is applicable to the present invention, a skilled in the art can make a choice according to actual needs, and this is not described here any more.

Correspondingly, this embodiment further provides a driving method of a pixel circuit, the pixel circuit including a plurality of pixel structures, and each pixel structure including a drive unit, a compensation unit and a light-emitting unit, wherein in the adjacent first pixel structure and second pixel structure, the first pixel structure further includes a capacitive touch unit, and the second pixel structure further includes a photosensitive touch unit; the driving method includes time division multiplexing the data line by the compensation unit in the first pixel structure, the compensation unit in the second pixel structure, the capacitive touch unit and the photosensitive touch unit, and time division multiplexing the read line by the capacitive touch unit and the photosensitive touch unit.

Specifically, in one frame time, the driving method includes the following phases:

a reset phase: providing a reset signal by the data line, resetting the drive unit by the compensation unit, and resetting the capacitive touch unit and the photosensitive touch unit at the same time;

a first drive phase: providing a first drive signal by the data line, discharging by the compensation unit in the first pixel structure; amplifying and acquiring a capacitive touch signal by the capacitive touch unit, and transmitting the capacitive touch signal to a touch execution unit through the read line; and implanting an initial signal in the photosensitive touch unit;

a second drive phase: providing a second drive signal by the data line, discharging by the compensation unit in the second pixel structure; stagnating the touch of the capacitive touch unit; amplifying and acquiring a photosensitive touch signal by the photosensitive touch unit, and transmitting the photosensitive touch signal to the touch execution unit through the read line; and a light emission phase: providing a light-emitting signal by the light emission control signal line, stagnating the touch of the capacitive touch unit and the touch of the photosensitive touch unit; driving the light-emitting units to emit light by the drive units in the first pixel structure and the second pixel structure respectively.

Figure 4:
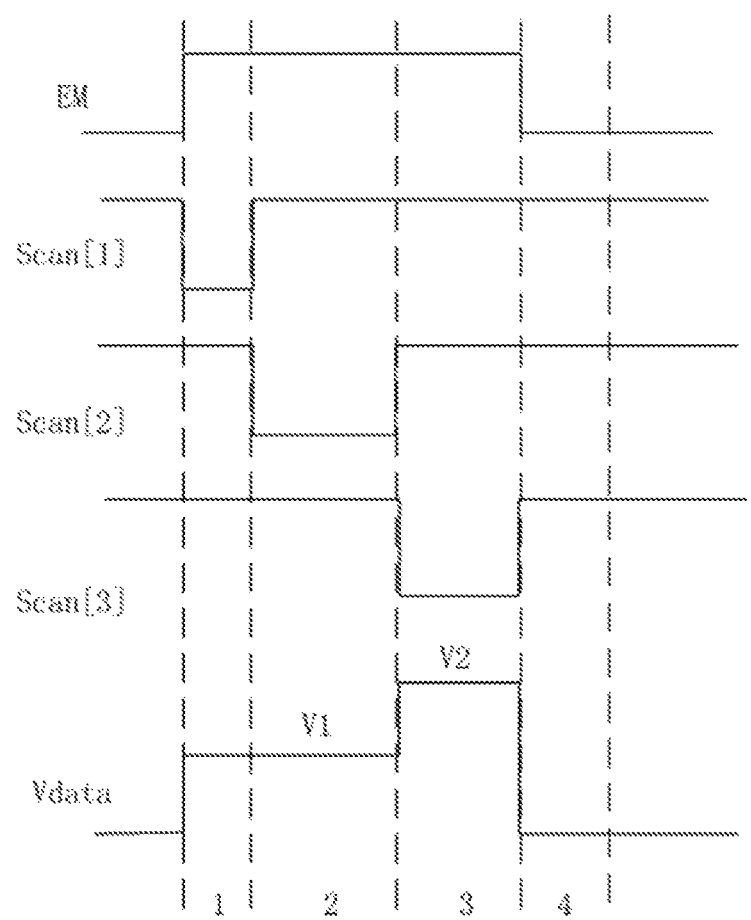
FIG. 4 is a drive sequence chart of the pixel circuit in the first embodiment of the present invention.

Specifically, the above phases of the driving method will be explained in details with reference to the sequence chart shown in FIG. 4.

Figure 5A:
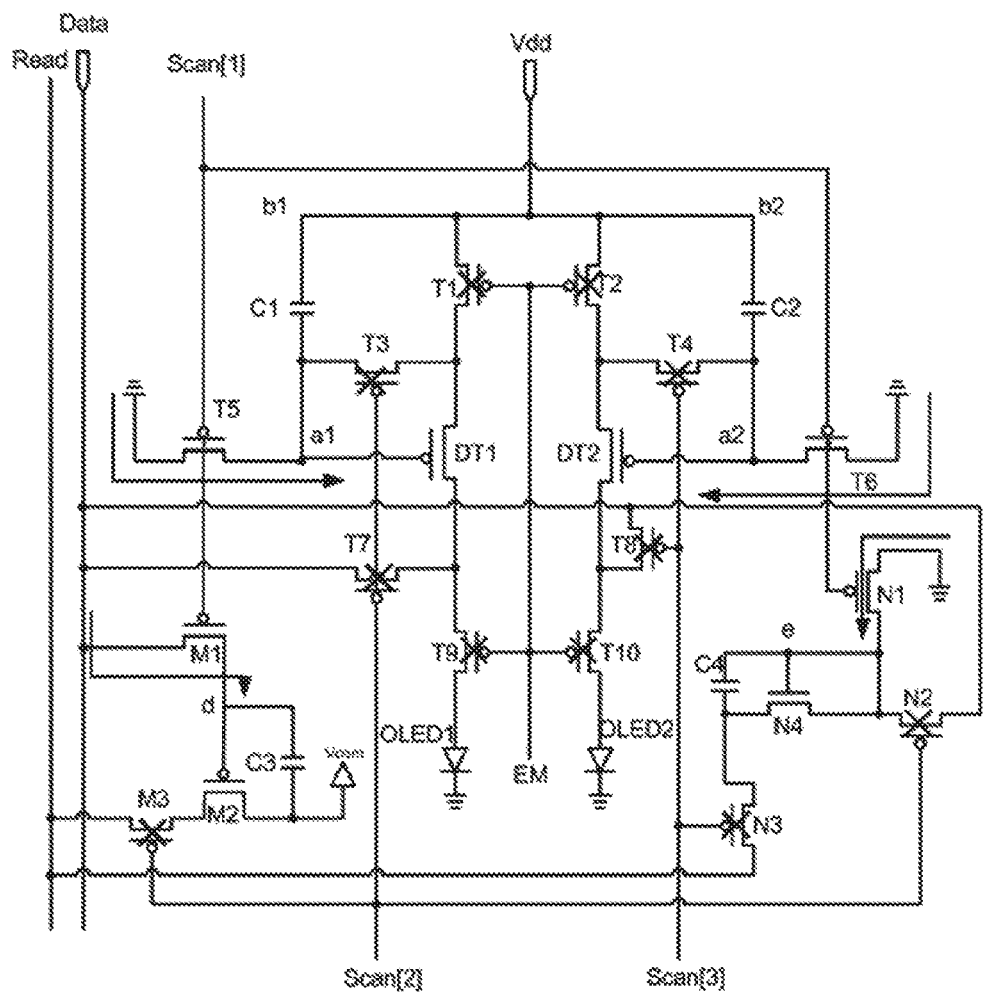
FIG. 5A to FIG. 5E are diagrams illustrating drive processes of the pixel circuit in the first embodiment of the present invention.
Figure 5B:
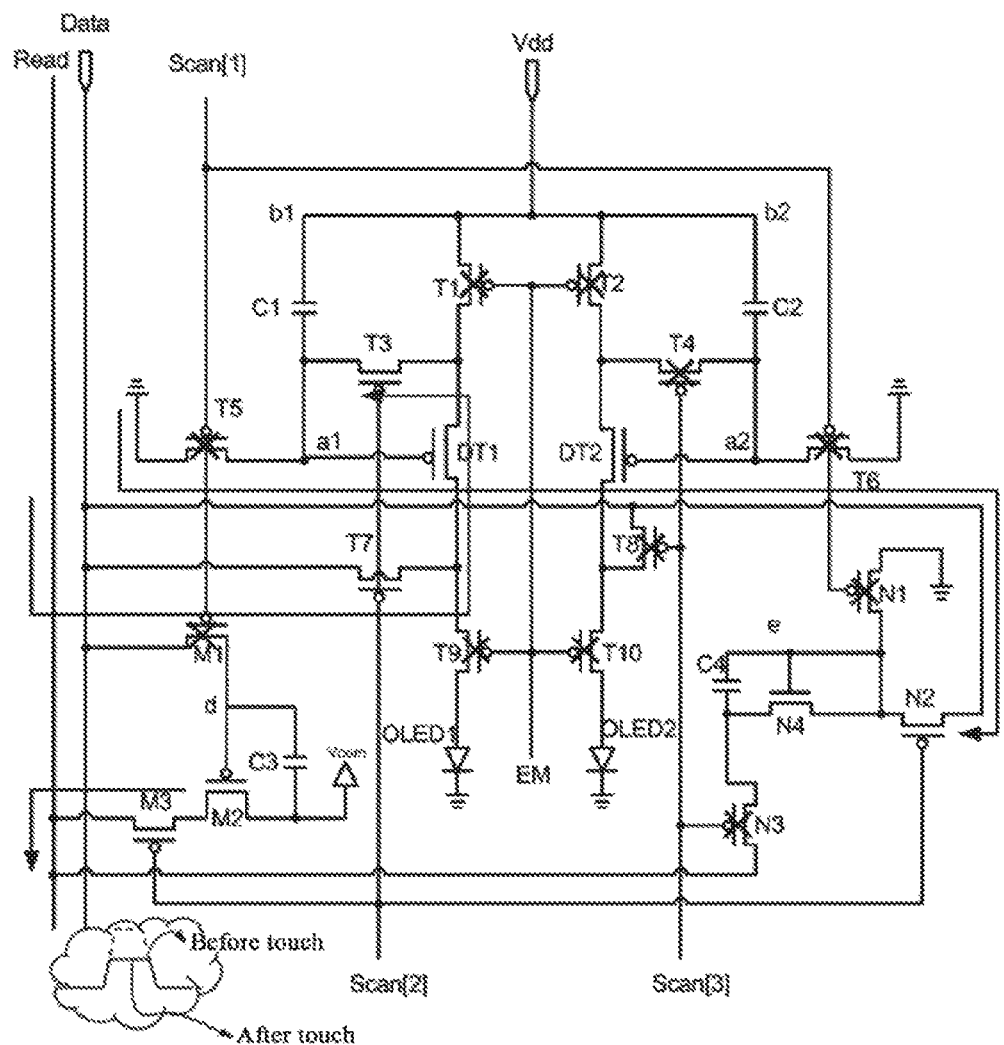

The reset phase corresponds to Process 1 in the sequence chart, and in this process, the EM inputs a high level, the Scan [1] inputs a low level, the Scan [2] and the Scan[3] input a high level and a data line voltage Vdata is a high level V1. FIG. 5A is a diagram illustrating states of the transistors in the pixel circuit in the reset phase, where 'x' represents cut-off state of a transistor, absence of 'x' represents an on-state of a transistor, paths and arrows represent directions of currents. FIG. 5B, FIG. 5D and FIG. 5E are diagrams illustrating states of the transistors in the pixel circuit in the first drive phase, the second drive phase and the light emission phase, respectively, where the meaning of the 'x' is the same as that in FIG. 5A.

In the reset phase, the Scan[1] inputs a low level, because the gate electrode of the fifth transistor T5 is connected to the Scan[1], the first electrode of the fifth transistor T5 is connected to a low potential terminal, the gate electrode of the sixth transistor T6 is connected to the Scan[1] and the first electrode of the sixth transistor T6 is connected to the low potential terminal, so the fifth transistor T5 and the sixth transistor T6 are turned on, and other switching transistors (the T1 to the T4, the T7 to the T10) are all cut off; a point a1 at one terminal of the first capacitor C1 and a point a2 at one terminal of the second capacitor C2 are both grounded, the potentials of the point a1 and the point a2 are all 0V.

Moreover, in the reset phase, the Vdata is a high level V1 for providing the reset signal to the capacitive touch unit, because the gate electrode of the first capacitive transistor M1 is connected to the Scan [1] and the first electrode of the first capacitive transistor M1 is connected to the Vdata, so the M1 is turned on and a potential of a point d is V1; the second capacitive transistor M2 and the third capacitive transistor M3 are both cut off at this time. This process is a preparation for accepting the capacitive touch (e.g., the finger touch).

In addition, in the reset phase, because the gate electrode of the first photo sensor N1 is connected to the Scan [1] and the first electrode of the first photo sensor N1 is connected to the low potential terminal, so the N1 is turned on, the fourth capacitor C4 and the fourth photo sensor N4 are grounded to reset and a potential of a point e is 0V. This process is a preparation for light sensing by the fourth photo sensor N4 at the next phase, and at this time, the N2 and the N3 are cut off.

The first drive phase corresponds to Process 2 in the sequence chart, and in this process, the EM inputs a high level, the Scan[1] and the Scan[3] input a high level, the Scan[2] inputs a low level and the Vdata is a high level V1. This process includes a process of discharging by the compensation unit in the first pixel structure; a process of amplifying and acquiring the capacitive touch signals of the capacitive touch unit, and a process of implanting the initial signal in the photosensitive touch unit, FIG. 5B is a diagram illustrating the states of the transistors in the pixel circuit in the first drive phase.

In the first drive phase, the T3, the T7 and the DT1 are turned on, the first pixel structure discharges along a path passing through the T7, the DT1 and the T3 in a direction indicated by an arrow, as shown in FIG. 5B, so that the final result of the discharge is: the potential of the point a1 is V1−Vth1, a potential of a point b1 is Vdd, where the Vth1 is a threshold voltage of the DT1.

Moreover, in the first drive phase, the M1 is cut off, and the M2 and the M3 are turned on. It should be understood that a coupling pulse signal (Vcom) in this phase on the one hand provides a potential on one terminal of the third capacitor C3 to form a coupling capacitance, and on the other hand is regarded as the source electrode of the amplifier transistor M2. The capacitive touch will directly lead to lowering the potential of the gate electrode of the M2, and only when a gate-source voltage ($V_{GS}$) of the M2 meets the on-state condition of the transistor will the signal pass through the M2. Therefore, this phase is a buffer phase of the capacitive touch unit, i.e., waiting for lowering the potential of the gate electrode of the M2, i.e., waiting for the finger touch.

Figure 5C:
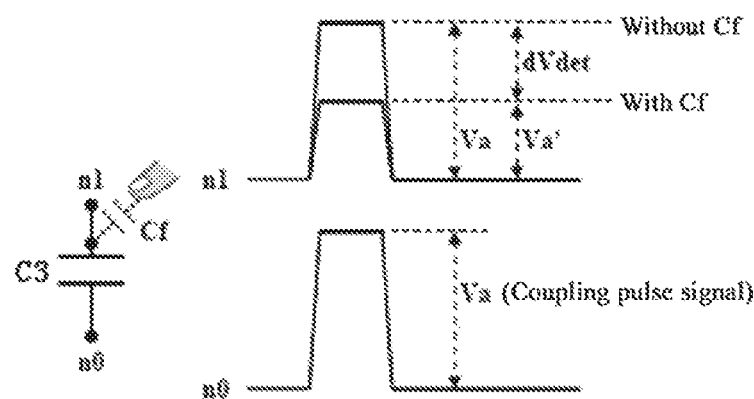
Figure 5D:
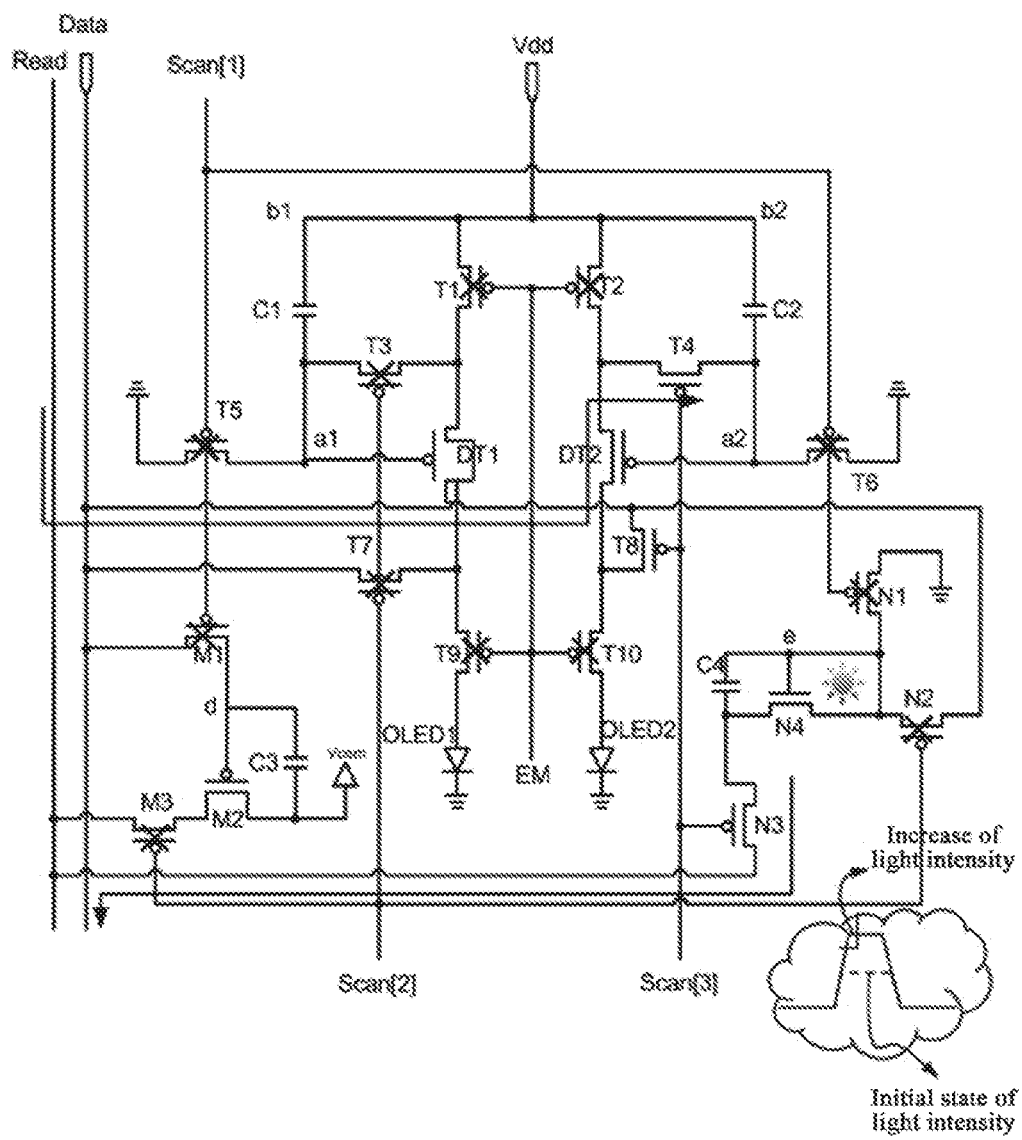
Figure 5E:
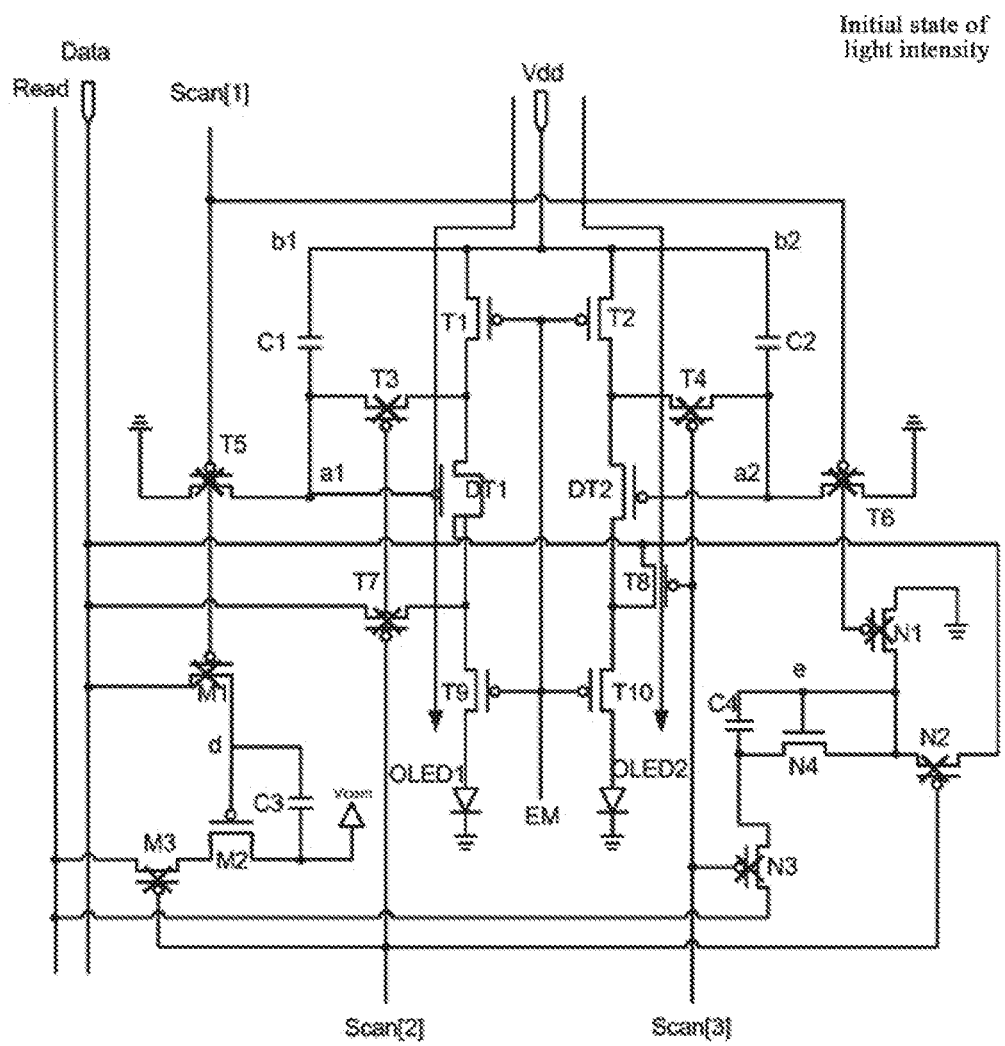

FIG. 5C shows a schematic diagram illustrating a case where a touch electrode (i.e., the third capacitor C3) is touched by a finger and the potential of the point d is lowered. The finger touch (equivalent to Cf in FIG. 5C) directly leads to lowering the potential of the point d, achieving an on-state condition of the M2, so that the M2 is turned on; when an I-V characteristic curve of the M2 is in an amplification region, the M2 is regarded as the amplifier transistor for amplifying the coupling pulse signal Vcom (equivalent to Va in FIG. 5C), so as to be conducive to acquisition of the touch signals. In the acquisition process of the finger touch signals, the signals in the X direction are horizontally acquired through the scan signal line Scan[2], and at the same time the signals in the Y direction are longitudinally acquired through the read line, thus determining X and Y coordinates of a position touched by the finger. In this phase, as long as the finger touches, the coordinates of its positions can be acquired at any time. In this phase, it is a first time to use the read line to acquire the touch signals.

In addition, in this embodiment, the N4 is a photo sensor, and in the first drive phase, the gate electrode and the source electrode of the N4 are connected, the N1 is cut off, the N2 is turned on, the coupling voltage V1 is output, and the potential of the point e is V1.

The second drive phase corresponds to Process 3 in the sequence chart, and in this process, the EM inputs a high level, the Scan[1] and the Scan[2] input a high level, the Scan[3] inputs a low level, the Vdata is a high level V2. This phase includes a process of discharging by the compensation unit in the second pixel structure; the capacitive touch unit being in a dead state and a process of amplifying and acquiring the initial signal of the photosensitive touch unit, FIG. 5D is a diagram illustrating the states of the transistors in the pixel circuit in the second drive phase.

In the second drive phase, the T4, the T8 and the DT2 are turned on, the second pixel structure discharges along a path passing through the T8, the DT2 and the T4 in a direction indicated by an arrow, as shown in FIG. 5D, so that the final result of the discharge is: a potential of the point a2 is V2−Vth2, a potential of a point b2 is Vdd, wherein the Vth2 is a threshold voltage of the DT2.

In the second drive phase, the transistors in the capacitive touch unit are all cut off, and the capacitive touch unit is in a dead state.

In addition, in the second drive phase, after a self potential conversion of the second photo sensor N2, a potential difference stored on the fourth capacitor C4 is a fixed value at this time, when the light is irradiated on the pixel structure, the intensity of light received by the fourth photo sensor N4 is increased, and a charge current is increased, and the voltage is temporarily stored at the two terminals of the C4. Then, the amplified stored signal is transmitted to the amplifier in the display device to be further amplified, and the further amplified signal is transmitted to a processor in the display device through the read line for data calculation and analysis. If a laser pointer touch action occurs in this phase, the processor will compare a change difference value between the photoelectric signal intensities before and after the touch with a non-touch threshold value, to judge whether there is a touch (if the change difference value between the photoelectric signal intensities is larger than the threshold value, there is a touch); if there is a touch, the signals in the X direction are horizontally acquired by the scan signal line Scan[3] to determine the X coordinate, while the signals in the Y direction are longitudinally acquired by the read line to determine the Y coordinate. In this phase, it is a second time to use the read line to acquire the touch signals.

The light emission phase corresponds to Process 4 in the sequence chart, and in this process, the EM inputs a low level, the Scan [1], the Scan [2] and the Scan [3] input a high level, and the Vdata is at a low level. In this phase, the light-emitting units in the first pixel structure and the second pixel structure emit light, the capacitive touch unit is in a dead state and the photosensitive touch unit is in a dead state, FIG. 5E is a diagram illustrating the states of the transistors in the pixel circuit in the light emission phase.

In the light emission phase, the EM inputs a low level signal, the first pixel structure and the second pixel structure are both switched in Vdd. At this time, the T1, the T9 and the DT1 are turned on, the first pixel structure provides a drive current $I_{OLED1}$ to the OLED1 along a path passing through the T1, the DT1 and the T9 in a direction indicated by an arrow, as shown in FIG. 5E, and the OLED1 emits light; the T2, the T10 and the DT2 are turned on, the second pixel structure provides a drive current $I_{OLED2}$ to the OLED2 along a path passing through the T2, the DT2 and the T10 in a direction indicated by an arrow, as shown in FIG. 5E, and the OLED2 emits light.

According to the formula for saturation current of the driving transistor, the current flowing through the OLED1 is:

$$I_{OLED1}=K(V_{GS}-V_{th})^2=K[V_{dd}-(V_1-V_{th1})-V_{th1}]^2=K(V_{dd}-V_1)^2$$

In a similar way, the current flowing through the OLED2 is:

$$I_{OLED2}=K(V_{dd}-V_2)^2$$

It can be seen from the above two formulae, at this time, the drive currents flowing through the OLED1 and the OLED2 are not affected by the threshold voltages Vth of their driving transistors, but only relate to the Vdata, thereby completely solving the problem of the impact on the drive currents $I_{OLED}$ caused by the threshold voltage drift of the transistors due to manufacturing process and long time operation, and ensuring a normal operation of the OLED.

In the light emission phase, all the transistors in the capacitive touch unit are cut off, and the capacitive touch unit is in a dead state; all the transistors in the photosensitive touch unit are cut off, and the photosensitive touch unit is in a dead state.

That is, in the light emission phase, only the drive unit, the compensation unit and the light-emitting unit are in operation, the capacitive touch unit and photosensitive touch unit are in a dead state, so that the impact on the light-emitting unit can be minimized.

In the pixel circuit of this embodiment, the two pixel structures are driven by sharing the compensation circuit, so that the number of the transistors in the compensation circuit is largely reduced, the size of the pixel pitch can be substantially compressed and the cost of IC is reduced, thereby obtaining higher image quality and higher PPI (Pixels Per Inch).

In addition, by time division multiplexing the data line in the pixel circuit, a capacitive touch function and a photosensitive touch function are further integrated, so that a display screen itself including the pixel circuit not only meets the requirement of the capacitive touch such as the finger touch, but also has a better identification function for the touch of the photosensitive touch such as the laser pointer touch. Meanwhile, the pixel circuit achieves scanning on the longitudinal signals of the capacitive touch unit and the photosensitive touch unit without using time domain acquisition. In this way, the read line may be multiplexed in a time division form to achieve acquisition of the touch coordinate signals, and, the read line may be placed between the pixel structures, thereby saving a wiring space and further obtaining higher PPI.

Second Embodiment

This embodiment provides a display device, including the pixel circuit in the first embodiment.

The display device includes a plurality of pixel structures arranged in a matrix form, the adjacent first pixel structure and second pixel structure may be adjacent sub-pixel units in the same pixel unit, or may be adjacent sub-pixel units in different adjacent pixel units. According to the design on the pixel unit in the display device, as shown in FIG. 6A, a pixel arrangement mode, in which the adjacent first pixel structure and second pixel structure are adjacent sub-pixel units in the same pixel unit, or as shown in FIG. 6B, a pixel arrangement mode, in which the adjacent first pixel structure and second pixel structure are adjacent sub-pixel units in different adjacent pixel units, may be designed according to actual needs.

In either of the above arrangement modes, the compensation unit in the first pixel structure, the compensation unit in the second pixel structure, the capacitive touch unit and the photosensitive touch unit share the data line, and the capacitive touch unit and the photosensitive touch unit share the read line, which not only can meet the requirement of the driving, but also can save the wiring space, so as to achieve a smaller pixel pitch and a finer pixel resolution.

Figure 6A:
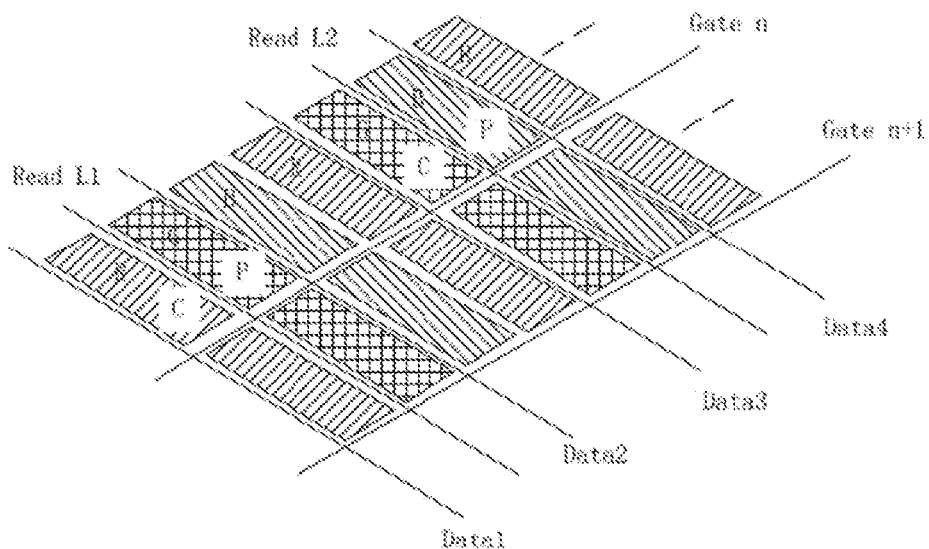
FIGS. 6A and 6B are schematic diagrams of arrangement modes of the sub-pixel units in a second embodiment of the present invention.
Figure 6B:
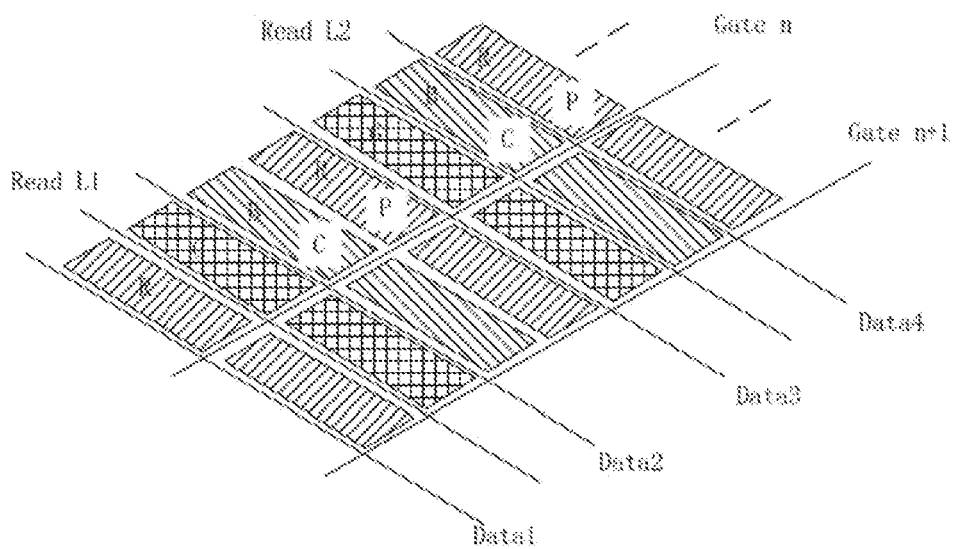

It should be understood that, according to the common RGB pixel arrangement mode in the prior art, any one of the arrangement modes shown in FIG. 6A and FIG. 6B may be employed, namely a sub-pixel is composed of a drive unit, a compensation unit and a touch unit (a capacitive touch unit), a sub-pixel is composed of another drive unit, another compensation unit and another touch unit (a photosensitive touch unit), wherein 'C' represents the capacitive touch unit, 'P' represents the photosensitive touch unit, the read line is shown on the left side in the figures just for being understood easily.

According to the requirements on the touch resolution, herein the sub-pixels with 'C' and 'P' may be in a periodic arrangement freely, as long as the data line and the read line for time division multiplexing belong to the same pixel unit. Hence, it is easy to understand that when the colors of the pixel are more than the RGB three-color arrangement, e.g., including RGBW four-color pixel, the sub-pixels are pairwise combined according to an arrangement order to form sub-pixel structures arranged in pairs, so as to form the adjacent sub-pixel units in the same pixel unit into the first pixel structure and the second pixel structure in the first embodiment.

The display device may be: any product or component with a display function, such as electronic paper, mobile phones, tablet computers, televisions, display devices, notebook computers, digital photo frames and navigators.

The display device in this embodiment employs the pixel circuit exemplified in the first embodiment, which is applicable to various touch modes, and has high pixel resolution, high display quality, small volume and long service life.

The pixel circuit in the present invention improves the flexibility of touch by integrating the capacitive touch function and the photosensitive touch function into a whole; the pixel circuit further combines the compensation units in the adjacent sub-pixel units into a whole, such that the adjacent sub-pixel units can share one data line (i.e., one data line controls the compensation units in the two sub-pixel units), thereby sharing the compensation unit to drive the two sub-pixel units. Hence, the number of the transistors in the compensation circuit and the number of the data lines may be reduced, the size of pixel pitch may be substantially compressed and the cost of IC is reduced, thereby obtaining higher image quality and higher PPI.

The pixel circuit in the present invention also solves the problem that the drive current is affected by inconsistent threshold voltages ($V_{th}$) of the driving transistors of the pixels due to manufacturing process and long time operation, thereby enabling the current flowing through the OLED in each pixel not to be affected by the threshold voltage $V_{th}$ of the driving transistor, and finally ensuring the uniformity of the image display. Moreover, the compensation unit ensures that there is no current flowing through the OLED in the reset phase and the drive phase of the pixel circuit, which indirectly prolongs service life of OLED.

It may be understood that the implementations as described above are merely exemplary implementations used for describing the principle of the present invention, but the present invention is not limited thereto. For a person of ordinary skill in the art, various variations and improvements can be made without departing from the spirit and essence of the present invention, and those variations and improvements shall also be regarded as falling into the protection scope of the present invention.

The invention claimed is:

1. A pixel circuit, comprising a plurality of pixel structures, each pixel structure comprising a drive unit, a compensation unit and a light-emitting unit, wherein in the adjacent first pixel structure and second pixel structure, the first pixel structure further comprises a capacitive touch unit, and the second pixel structure further comprises a photosensitive touch unit; the compensation unit in the first pixel structure, the compensation unit in the second pixel structure, the capacitive touch unit and the photosensitive touch unit share a data line, and the capacitive touch unit and the photosensitive touch unit share a read line, wherein:

the compensation unit is configured to adjust a drive voltage of a driving transistor in the drive unit, so as to eliminate the impact of a threshold voltage of the driving transistor on a current flowing through the light-emitting unit, and the data line is configured to provide a data signal to the driving transistor;

the capacitive touch unit is configured to generate a corresponding electrical signal according to a capacitive touch signal, the data line is configured to provide an initial signal to the capacitive touch unit, and the read line is configured to read the capacitive touch signal; and the photosensitive touch unit is configured to generate a corresponding electrical signal according to a photosensitive touch signal, the data line is configured to provide an initial signal to the photosensitive touch unit, and the read line is configured to read the photosensitive touch signal.

2. The pixel circuit according to claim 1, wherein the compensation unit in the first pixel structure and the compensation unit in the second pixel structure are of the same structure and arranged symmetrically, the data line is arranged between the compensation unit in the first pixel structure and the compensation unit in the second pixel structure, and connected to the compensation unit in the first pixel structure and the compensation unit in the second pixel structure respectively.

3. The pixel circuit according to claim 2, wherein the drive unit in the first pixel structure comprises a first driving transistor, and the drive unit in the second pixel structure comprises a second driving transistor; the first driving transistor and the second driving transistor are of the same structure and arranged symmetrically; the data line is arranged between the first driving transistor and the second driving transistor, and connected to the first driving transistor and the second driving transistor respectively.

4. The pixel circuit according to claim 3, wherein the compensation unit in the first pixel structure comprises a first transistor, a third transistor, a fifth transistor, a seventh transistor, a ninth transistor and a first capacitor, the compensation unit in the second pixel structure comprises a second transistor, a fourth transistor, a sixth transistor, an eighth transistor, a tenth transistor and a second capacitor; the pixel circuit further comprises a first scan line, a second scan line, a third scan line and a light emission control signal line, wherein:

a gate electrode of the first transistor is connected to a gate electrode of the second transistor, and also connected to the light emission control signal line, a first electrode of the first transistor is respectively connected to a first electrode of the second transistor and a high voltage terminal, and a second electrode of the first transistor is connected to a first electrode of the first driving transistor;

a gate electrode of the third transistor is connected to the second scan line, a first electrode of the third transistor is respectively connected to one terminal of the first capacitor and a gate electrode of the first driving transistor, and a second electrode of the third transistor is connected to the first electrode of the first driving transistor;

a gate electrode of the fifth transistor is connected to the first scan line, a first electrode of the fifth transistor is connected to a low potential terminal, and a second electrode of the fifth transistor is connected to the gate electrode of the first driving transistor;

a gate electrode of the seventh transistor is connected to the second scan line, a first electrode of the seventh transistor is connected to the data line, and a second electrode of the seventh transistor is respectively connected to a second electrode of the first driving transistor and a first electrode of the ninth transistor;

a gate electrode of the ninth transistor is connected to a gate electrode of the tenth transistor, and also connected to the light emission control signal line, the first electrode of the ninth transistor is connected to the second electrode of the first driving transistor, and a second electrode of the ninth transistor is connected to the light-emitting unit in the first pixel structure;

one terminal of the first capacitor is connected to the first electrode of the first transistor, and the other terminal thereof is connected to the first electrode of the third transistor;

a second electrode of the second transistor is connected to the first electrode of the second driving transistor;

a gate electrode of the fourth transistor is connected to the third scan line, a first electrode of the fourth transistor is respectively connected to one terminal of the second capacitor and a gate electrode of the second driving transistor, and a second electrode of the fourth transistor is connected to a first electrode of the second driving transistor;

a gate electrode of the sixth transistor is connected to the first scan line, a first electrode of the sixth transistor is connected to the low potential terminal, and a second electrode of the sixth transistor is connected to the gate electrode of the second driving transistor;

a gate electrode of the eighth transistor is connected to the third scan line, a first electrode of the eighth transistor is connected to the data line, and a second electrode of the eighth transistor is respectively connected to the second electrode of the second driving transistor and a first electrode of the tenth transistor;

the first electrode of the tenth transistor is connected to the second electrode of the second driving transistor, and a second electrode of the tenth transistor is connected to the light-emitting unit in the second pixel structure; and one terminal of the second capacitor is connected to the first electrode of the second transistor, and the other terminal thereof is connected to the first electrode of the fourth transistor.

5. The pixel circuit according to claim 4, wherein the capacitive touch unit comprises a first capacitive transistor, a second capacitive transistor, a third capacitive transistor and a third capacitor, wherein:

a gate electrode of the first capacitive transistor is connected to the first scan line, a first electrode of the first capacitive transistor is connected to the data line, and a second electrode of the first capacitive transistor is respectively connected to a gate electrode of the second capacitive transistor and one terminal of the third capacitor;

a first electrode of the second capacitive transistor is respectively connected to the other terminal of the third capacitor and a reference potential terminal, and a second electrode of the second capacitive transistor is connected to a second electrode of the third capacitive transistor; and a gate electrode of the third capacitive transistor is connected to the photosensitive touch unit, and a first electrode of the third capacitive transistor is connected to the read line.

6. The pixel circuit according to claim 5, wherein the photosensitive touch unit comprises a first photo sensor, a second photo sensor, a third photo sensor, a fourth photo sensor and a fourth capacitor, wherein:

a gate electrode of the first photo sensor is connected to the first scan line, a first electrode of the first photo sensor is connected to the low potential terminal, and a second electrode of the first photo sensor is respectively connected to a second electrode of the second photo sensor, a gate electrode and a first electrode of the fourth photo sensor;

a gate electrode of the second photo sensor is connected to the gate electrode of the third capacitive transistor in the capacitive touch unit, a first electrode of the second photo sensor is connected to the data line, and the second electrode of the second photo sensor is connected to the first electrode of the fourth photo sensor;

a gate electrode of the third photo sensor is connected to the third scan line, a first electrode of the third photo sensor is connected to a second electrode of the fourth photo sensor, and a second electrode of the third photo sensor is connected to the read line; and one terminal of the fourth capacitor is connected to the gate electrode of the fourth photo sensor, and the other terminal thereof is connected to the second electrode of the fourth photo sensor.

7. The pixel circuit according to claim 6, wherein the light-emitting unit in the first pixel structure comprises a first organic light-emitting diode of which an anode is connected to the second electrode of the ninth transistor and a cathode is connected to the low potential terminal; and the light-emitting unit in the second pixel structure comprises a second organic light-emitting diode of which an anode is connected to the second electrode of the tenth transistor and a cathode is connected to the low potential terminal.

8. The pixel circuit according to claim 7, wherein the first transistor to the tenth transistor, the first photo sensor to the fourth photo sensor, the first capacitive transistor to the third capacitive transistor, the first driving transistor and the second driving transistor are all P type thin film transistors, wherein the first electrodes are source electrodes, and the second electrodes are drain electrodes.

9. A display device, comprising the pixel circuit according to claim 1.

10. A display device, comprising the pixel circuit according to claim 2.

11. A display device, comprising the pixel circuit according to claim 3.

12. A display device, comprising the pixel circuit according to claim 4.

13. A display device, comprising the pixel circuit according to claim 5.

14. A display device, comprising the pixel circuit according to claim 6.

15. A display device, comprising the pixel circuit according to claim 7.

16. A display device, comprising the pixel circuit according to claim 8.

17. The display device according to claim 9, wherein the adjacent first pixel structure and second pixel structure are adjacent sub-pixel units in the same pixel unit.

18. The display device according to claim 10, wherein the adjacent first pixel structure and second pixel structure are adjacent sub-pixel units in the same pixel unit.

19. A driving method of a pixel circuit, the pixel circuit comprising a plurality of pixel structures, and each pixel structure comprising a drive unit, a compensation unit and a light-emitting unit, wherein in the adjacent first pixel structure and second pixel structure, the first pixel structure further comprises a capacitive touch unit, and the second pixel structure further comprises a photosensitive touch unit; the driving method comprises: time division multiplexing the data line by the compensation unit in the first pixel structure, the compensation unit in the second pixel structure, the capacitive touch unit and the photosensitive touch unit, and time division multiplexing the read line by the capacitive touch unit and the photosensitive touch unit.

20. The driving method according to claim 19, wherein in one frame time, the driving method comprises the following phases:
- a reset phase: providing a reset signal by the data line, resetting the drive unit by the compensation unit, and resetting the capacitive touch unit and the photosensitive touch unit at the same time;
- a first drive phase: providing a first drive signal by the data line, discharging by the compensation unit in the first pixel structure; amplifying and acquiring a capacitive touch signal by the capacitive touch unit, and transmitting the capacitive touch signal to a touch execution unit through the read line; and implanting an initial signal in the photosensitive touch unit;
- a second drive phase: providing a second drive signal by the data line, discharging by the compensation unit in the second pixel structure; stagnating touch control of the capacitive touch unit; amplifying and acquiring a photosensitive touch signal by the photosensitive touch unit, and transmitting the photosensitive touch signal to the touch execution unit through the read line; and
- a light emission phase: providing a light-emitting signal by the light-emitting control signal line, stagnating touch control of the capacitive touch unit and the photosensitive touch unit; driving the light-emitting unit to emit light by the drive units in the first pixel structure and the second pixel structure respectively.

* * * * *